US008760218B2

(12) United States Patent
Zhu

(10) Patent No.: US 8,760,218 B2
(45) Date of Patent: Jun. 24, 2014

(54) SYSTEM AND METHOD FOR OPERATING AN ELECTRIC POWER CONVERTER

(75) Inventor: Huibin Zhu, Westford, MA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/465,788

(22) Filed: May 7, 2012

(65) Prior Publication Data
US 2013/0293287 A1 Nov. 7, 2013

(51) Int. Cl.
G05F 1/10 (2006.01)

(52) U.S. Cl.
USPC ........... 327/538; 327/432; 327/423; 323/312; 361/91.1; 361/91.4; 361/91.6; 361/118

(58) Field of Classification Search
USPC ......... 327/538, 432, 440, 442, 478, 479, 434, 327/423; 323/266, 268, 271, 272, 274, 275, 323/276, 277, 311, 312; 361/91.1, 91.4, 361/91.5, 91.6, 103, 118
See application file for complete search history.

(56) References Cited

U.S. PATENT DOCUMENTS

| 4,949,213 | A | 8/1990 | Sasagawa et al. |
| 5,210,479 | A | 5/1993 | Kimura et al. |
| 5,396,117 | A | 3/1995 | Housen et al. |
| 5,596,466 | A | 1/1997 | Ochi |
| 6,160,694 | A | 12/2000 | Crespi et al. |
| 6,531,908 | B1 | 3/2003 | Goeser et al. |
| 6,545,452 | B2 | 4/2003 | Bruckmann et al. |
| 7,042,691 | B2 | 5/2006 | Kim et al. |
| 7,119,586 | B2 | 10/2006 | Hornkamp |
| 7,129,759 | B2 * | 10/2006 | Fukami .......................... 327/110 |
| 7,176,744 | B2 | 2/2007 | Goudo |
| 7,310,006 | B2 * | 12/2007 | Shimada ......................... 326/83 |
| 7,315,439 | B2 | 1/2008 | Muenzer et al. |
| 7,453,308 | B2 * | 11/2008 | Tihanyi ......................... 327/309 |
| 7,466,185 | B2 | 12/2008 | Bayerer |
| 7,548,097 | B2 * | 6/2009 | Dake et al. ..................... 327/110 |
| 7,576,964 | B2 * | 8/2009 | Nakahara ...................... 361/91.1 |
| 7,724,065 | B2 | 5/2010 | Bayerer et al. |

(Continued)

FOREIGN PATENT DOCUMENTS

DE 4428675 2/1996
EP 0680147 A2 11/1995

OTHER PUBLICATIONS

Krapp, Johannes, et al. IGBT Drivers Provide Reliable Protection, Motion Control, Oct. 2010, 3 pages, Bodo's Power Systems, www.bodospower.com.

(Continued)

Primary Examiner — Lincoln Donovan
Assistant Examiner — Jung H Kim
(74) Attorney, Agent, or Firm — James McGinness; Armstrong Teasdale LLP

(57) ABSTRACT

A regulating system for an insulated gate bipolar transistor (IGBT) includes a clamping circuit coupled to the IGBT. The IGBT is coupled to a gate driver circuit. The regulating system also includes a feedback channel coupled to the clamping circuit. The feedback channel is configured to transmit signals representative of a conduction state of said clamping circuit. The regulating system further includes at least one gate driver controller coupled to the feedback channel and the gate driver circuit. The gate drive controller is configured to regulate temporal periodicities of the IGBT in an on-condition and an off-condition.

20 Claims, 3 Drawing Sheets

(56) References Cited

U.S. PATENT DOCUMENTS

| | | |
|---|---|---|
| 7,768,337 B2 | 8/2010 | Bayerer |
| 2009/0067109 A1* | 3/2009 | Huang et al. .................. 361/93.1 |
| 2010/0194451 A1 | 8/2010 | Nuutinen |
| 2011/0019453 A1* | 1/2011 | Gonzalez Senosiain et al. ............................. 363/131 |
| 2011/0174308 A1* | 7/2011 | Blunsden et al. ......... 128/204.21 |

OTHER PUBLICATIONS

Chen Lei, Hong, et al., Keeping Inverters Safe, Energy Efficiency & Technology, May 2011, 11 pages, http://www.eetweb.com/power-supplies/keeping-inverters-safe-0511 /index . html.

Desaturation Fault Detection, Optocoupler Gate Drive Products with Feature: ACPL-333J, ACPL-330J, ACPL-332J, ACPL-331J and HCPL-316J, Application Note 5324, Avago Technologies, Jul. 2010, 7 pages, www.avagotech.com.

Khan, Jamshe Namdar, Design considerations in Using the Inverter Gate Driver Optocouplers for Variable Speed Motor Drives, White Paper, Avago Technologies, Mar. 2010, 11 pages, www.avagotech.com.

PCT Search Report and Written Opinion dated Aug. 20, 2013 from corresponding Application No. PCT/US2013/038559.

* cited by examiner

SYSTEM AND METHOD FOR OPERATING AN ELECTRIC POWER CONVERTER

BACKGROUND OF THE INVENTION

The subject matter described herein relates generally to controlling operation of electric power converters, and more specifically, to controlling operation of insulated gate bipolar transistors (IGBTs).

Many known semiconductor devices are used for electric power conversion, e.g., rectifiers and inverters. Most known rectifiers are used for converting alternating current (AC) to direct current (DC) and most known inverters are used for converting DC current to AC current. Some of these rectifiers and inverters are integrated into full power conversion assemblies, i.e., power converters, used in renewable electric power generation facilities that include solar power generation farms and wind turbine farms. However, variables such as solar intensity and wind direction and speed typically produce electric power having varying voltage and/or frequency. Power converters may be coupled between the electric power generation devices in the generation facilities and an electric utility grid. Each power converter receives generated electric power from the associated generation device and transmits electricity having a fixed voltage and frequency for further transmission to the utility grid via a transformer. The transformer may be coupled to a plurality of power converters associated with the electric power generation facility.

Many known semiconductor devices include power bridge circuits that include insulated gate bipolar transistors (IGBTs). Each IGBT includes a gate coupled to a low voltage control circuit, wherein such low voltage is typically defined on the order of magnitude of volts (V). Each IGBT also includes a collector and an emitter coupled to a high voltage circuit, wherein such high voltage is typically defined on the order of magnitude of kilovolts (kV). A load is typically coupled to the collector. During operation, when the IGBT is in an "on-condition", energy is stored in the load and in a channel that extends between the collector and the load and a channel that extends between the collector and the emitter. The stored energy is proportional to the sum of the inductances associated with the load and the channels, such inductances typically referred to as stray inductances. During IGBT turn-off transients, a voltage excursion is induced between the collector and the emitter of the associated IGBT, such voltage typically referred to as $V_{CE}$. The $V_{CE}$ increase is proportional to a rate of change of electric current as a function of time, i.e., a di/dt, and the sum of the stray inductances. The value of the di/dt may be on the order of thousands of amperes per microsecond. Such $V_{CE}$ excursions may decrease the life expectancy of the IGBT.

At least some known IGBTs include "active clamping" circuits that include a plurality of Zener diodes coupled in series between the gate of the IGBT and the collector on the low voltage side of the IGBT. The series Zener diode circuit may also include resistors, clamping diodes, and switches to facilitate clamping the voltage at the collector to a predetermined value that is typically the sum of the voltage drop across each Zener diode. Such voltage clamping is facilitated by the Zener diodes permitting electric current to flow in the reverse direction when the collector voltage exceeds the predetermined breakdown voltage, sometimes referred to as the "Zener knee voltage." The voltage clamping is further facilitated by maintaining the IGBT in a partial "on-state" for a short period of time, thereby facilitating some current to circulate through a circuit defined by the gate and the collector of the IGBT and the Zener diodes. The energy associated with the voltage transient dissipates as heat energy as the induced electric current is transmitted through the circuit, thereby limiting the voltage excursion. However, the increased temperatures due to the heat release may decrease the service life of the IGBT and the Zener diodes.

Moreover, such known clamping circuits must be uniquely designed and assembled for each IGBT configuration and operational use. Specifically, the clamping threshold is difficult to adjust for each individual direct current (DC) bus voltage rating as there is no easy way to tune the knee voltage of the Zener diodes. Therefore, each individual power bridge circuit typically requires substantial experimentation and testing, and assembling a clamping circuit for variable voltages is not practical. Also, for those power bridge circuits having consistent DC bus voltage ratings, variations of the stray inductances associated with the IGBT and the load will induce voltage variations at the collector that may not be easy to control. Further, a failure of one Zener diode in the series circuit may induce a "false turn-on" for an IGBT in an otherwise "off-state", thereby potentially shortening the life expectancy of the associated IGBT. Moreover, if the series Zener diode clamping circuit is repeatedly activated, the thermal limits of the Zener diodes may be approached, thereby limiting the effectiveness of the affected Zener diodes and reducing the effectiveness of the associated clamping circuit. Known methods to better protect the Zener diodes in the clamping circuit include increasing thermal capacities of the hardware, adding a switch to disconnect the Zener clamping circuit, and draining excessive gate charges to facilitate softer, i.e., extended IGBT turn-off. However, the root cause of the potential failure conditions of the Zener diodes, i.e., a lack of active clamping circuit regulation of the voltage excursions, is not addressed by these known methods.

BRIEF DESCRIPTION OF THE INVENTION

In one aspect, a regulating system for an insulated gate bipolar transistor (IGBT) is provided. The IGBT is coupled to a gate driver circuit. The regulating system includes a clamping circuit coupled to the IGBT. The regulating system also includes a feedback channel coupled to the clamping circuit. The feedback channel is configured to transmit signals representative of a conduction state of the clamping circuit. The regulating system further includes at least one gate driver controller coupled to the feedback channel and the gate driver circuit. The gate drive controller is configured to regulate temporal periodicities of the IGBT in an on-condition and an off-condition.

In another aspect, an electric power converter for a renewable power source is provided. The electric power converter includes a plurality of insulated gate bipolar transistors (IGBTs). The electric power converter also includes a gate driver circuit coupled to each of the IGBTs. The electric power converter also includes an IGBT regulating system that includes a clamping circuit coupled to the IGBT. The IGBT regulating system also includes a feedback channel coupled to the clamping circuit and the gate driver circuit. The feedback channel is configured to transmit signals representative of a conduction state of the clamping circuit. The IGBT regulating system further includes at least one gate driver controller coupled to the feedback channel. The gate drive controller is configured to regulate temporal periodicities of the IGBT in an on-condition and an off-condition.

In yet another aspect, a method of operating an electric power converter is provided. The electric power converter includes a plurality of insulated gate bipolar transistors (IGBTs) and a clamping circuit coupled to each of the IGBTs through an IGBT gate terminal. The electric power converter also includes a gate driver controller coupled to the clamping circuit. The method includes transmitting a reverse current through the clamping circuit. The method also includes transmitting a feedback signal to the gate driver controller representative of at least one of the presence of the reverse current and a value of the reverse current. The method further includes regulating at least one operational parameter of the electric power converter.

DETAILED DESCRIPTION OF THE INVENTION

Figure 1:
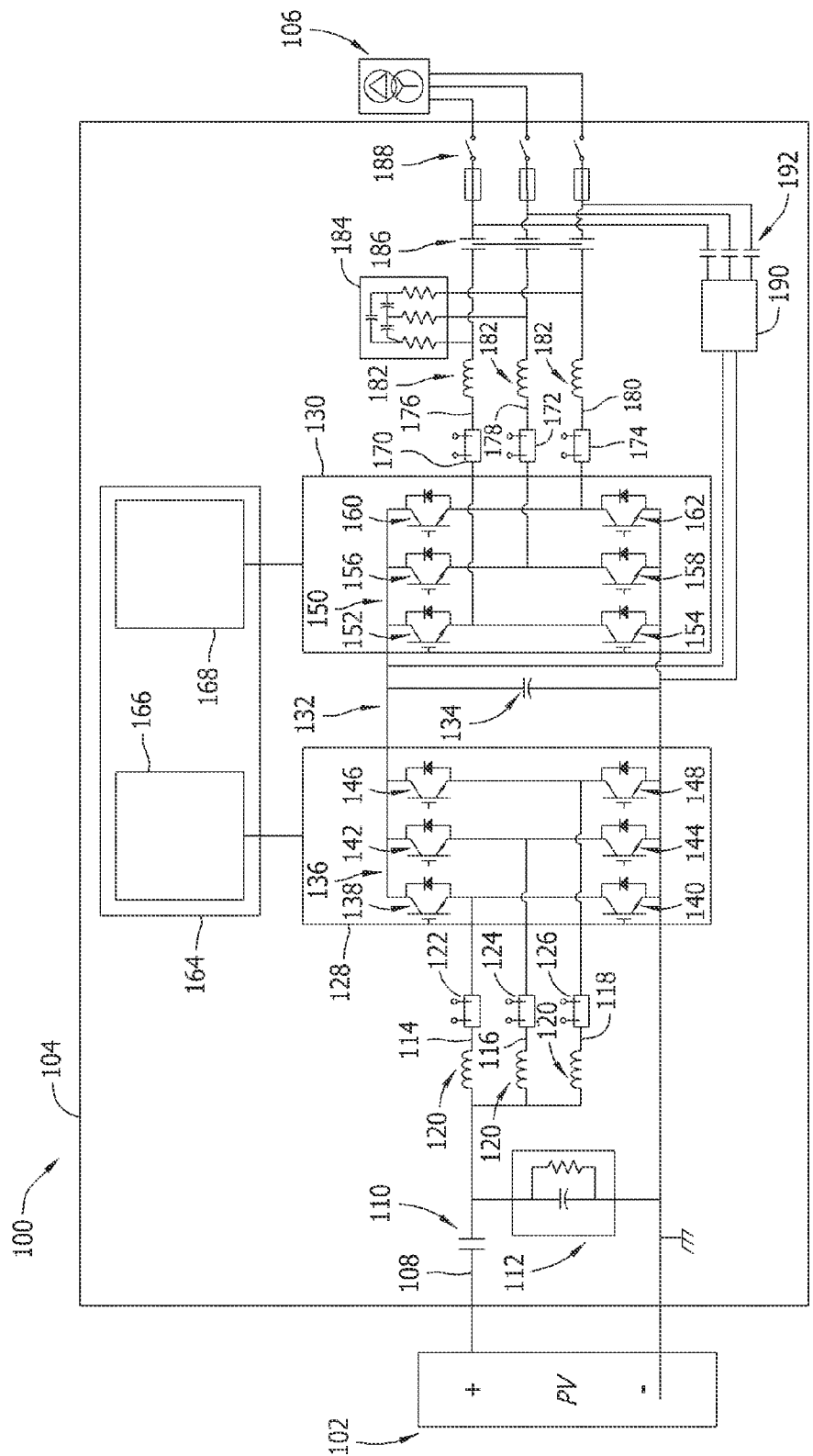
FIG. 1 is a schematic diagram of an exemplary power generation system.

Technical effects of the methods, apparatus, and systems described herein include at least one of: (a) increasing a range of operation of devices that use insulated gate bipolar transistors (IGBTs); (b) controlling electric current induced and dissipated by an IGBT "turn-off" operation such that thermal limits of the associated IGBT and Zener diodes in an associated clamping circuit are not approached; (c) controlling operation of an IGBT and alerting operators to potential thermal stress exceedences as a function of a frequency of activation of a clamping circuit and durations of such activation; (d) regulating an IGBT gate voltage to slow-down the rate of an IGBT turn-off, regulating the current transmitted between a collector and emitter of an IGBT, thereby controlling a rate of change of current with respect to time, and clamping the collector-to-emitter voltage; (e) increasing a tolerable range of collector-to-emitter voltages induced by stray inductances during an IGBT "turn-off" operation while dissipating electric current through the IGBT and connecting current-carrying channels; (f) increasing a tolerable range of stray inductances that at least partially induce voltage excursions during an IGBT "turn-off" operation while dissipating electric current through the IGBT and connecting current-carrying channels; (g) facilitating an increase in a power conversion capacity of each IGBT within an electric power converter due to increased regulation of heat generation in the IGBTs and Zener diodes during an IGBT "turn-off" operation; (h) facilitating an increase in reliability of each IGBT and Zener diode within an electric power converter due to decreased thermal stresses induced on the devices; and (i) increasing a switching rate of the IGBTs and improving the power quality transmitted from the electric power converters due to decreased thermal stresses induced on the IGBTs and Zener diodes;

The methods, apparatus, and systems described herein facilitate increasing a power conversion rate and reliability of electric power converters. As described herein, such increases in power conversion rates are facilitated by controlling a rate of heat generation by IGBTs and Zener diodes within the electric power converters by using an IGBT regulating system to regulate dissipation of an induced current and heat generated therefrom. Also, as described herein, such regulation facilitates improved heat generation within and heat removal from the IGBTs and Zener diodes that facilitates decreasing nominal operating temperatures and rate of temperature changes thereof, thereby decreasing a magnitude of thermal stresses induced in the IGBTs and Zener diodes. Furthermore, the embodiments described herein use clamping frequency and duration determinations based on the electric current feedback from the clamping circuit as the primary variables for regulating the current transmitted therein. Moreover, the embodiments described herein use a combination of warnings, alarms, and protective actions to protect the IGBTs and Zener diodes. At least some of the embodiments of the methods, apparatus, and systems described herein use mechanisms that remove the Zener diodes in the clamping circuit, the IGBTs, and the electric power converter from service. Therefore, regulating the current transmitted through the IGBTs and Zener diodes and the temperature rise thereof facilitates increasing the ratings of the electric power conversion circuits (i.e., bridges), faster switching of the IGBTs, and improved power quality.

FIG. 1 is a schematic diagram of an exemplary power generation system 100 that includes a plurality of power generation units, such as a plurality of solar panels (not shown) that form at least one solar array 102. Alternatively, power generation system 100 includes any suitable number and type of power generation units, such as a plurality of wind turbines, fuel cells, geothermal generators, hydropower generators, and/or other devices that generate power from renewable and/or non-renewable energy sources.

In the exemplary embodiment, power generation system 100 and/or solar array 102 includes any number of solar panels to facilitate operating power generation system 100 at a desired power output. In one embodiment, power generation system 100 includes a plurality of solar panels and/or solar arrays 102 coupled together in a series-parallel configuration to facilitate generating a desired current and/or voltage output from power generation system 100. Solar panels include, in one embodiment, one or more of a photovoltaic panel, a solar thermal collector, or any other device that converts solar energy to electrical energy. In the exemplary embodiment, each solar panel is a photovoltaic panel that generates substantially direct current (DC) power as a result of solar energy striking solar panels.

In the exemplary embodiment, solar array 102 is coupled to a power conversion assembly 104, i.e., an electric power converter 104, that converts the DC power to alternating current (AC) power. The AC power is transmitted to an electrical distribution network 106, or "grid." Power converter 104, in the exemplary embodiment, adjusts an amplitude of the voltage and/or current of the converted AC power to an amplitude suitable for electrical distribution network 106, and provides AC power at a frequency and a phase that are substantially equal to the frequency and phase of electrical distribution network 106. Moreover, in the exemplary embodiment, power converter 104 provides three phase AC power to electrical distribution network 106. Alternatively, power converter 104 provides single phase AC power or any other number of phases of AC power to electrical distribution network 106.

DC power generated by solar array 102, in the exemplary embodiment, is transmitted through a converter conductor 108 coupled to power converter 104. In the exemplary embodiment, a protection device 110 electrically disconnects solar array 102 from power converter 104, for example, if an error or a fault occurs within power generation system 100. As used herein, the terms "disconnect" and "decouple" are used interchangeably, and the terms "connect" and "couple" are used interchangeably. Current protection device 110 is a circuit breaker, a fuse, a contactor, and/or any other device that enables solar array 102 to be controllably disconnected from power converter 104. A DC filter 112 is coupled to converter conductor 108 for use in filtering an input voltage and/or current received from solar array 102.

Converter conductor 108, in the exemplary embodiment, is coupled to a first input conductor 114, a second input conductor 116, and a third input conductor 118 such that the input current is split between first, second, and third input conductors 114, 116, and 118. Alternatively, the input current may be transmitted to a single conductor, such as converter conductor 108, and/or to any other number of conductors that enables power generation system 100 to function as described herein. At least one boost inductor 120 is coupled to each of first input conductor 114, second input conductor 116, and/or third input conductor 118. Boost inductors 120 facilitate filtering the input voltage and/or current received from solar array 102. In addition, at least a portion of the energy received from solar array 102 is temporarily stored within each boost inductor 120.

In the exemplary embodiment, a first input current sensor 122 is coupled to first input conductor 114, a second input current sensor 124 is coupled to second input conductor 116, and a third input current sensor 126 is coupled to third input conductor 118. First, second, and third input current sensors 122, 124, and 126 measure the current flowing through first, second, and third input conductors 114, 116, and 118, respectively.

In the exemplary embodiment, power converter 104 includes a DC to DC, or "boost," converter 128 and an inverter 130 coupled together by a DC bus 132. Boost converter 128, in the exemplary embodiment, is coupled to, and receives DC power from, solar array 102 through first, second, and third input conductors 114, 116, and 118. Moreover, boost converter 128 adjusts the voltage and/or current amplitude of the DC power received. In the exemplary embodiment, inverter 130 is a DC-AC inverter that converts DC power received from boost converter 128 into AC power for transmission to electrical distribution network 106. Alternatively, for those embodiments that include electric power generation devices such as, without limitation, wind turbines, that generate a variable AC frequency and voltage, boost converter 128 may be replaced with, or supplemented with, an electrical rectification device such that power converter 104 would be a full power conversion assembly. Moreover, in the exemplary embodiment, DC bus 132 includes at least one capacitor 134. Alternatively, DC bus 132 includes a plurality of capacitors 134 and/or any other electrical power storage devices that enable power converter 104 to function as described herein. As current is transmitted through power converter 104, a voltage is generated across DC bus 132 and energy is stored within capacitors 134.

Boost converter 128, in the exemplary embodiment, includes two converter switches 136 coupled together in serial arrangement for each phase of electrical power that power converter 104 produces. In the exemplary embodiment, converter switches 136 are semiconductor devices, e.g., insulated gate bipolar transistors (IGBTs). Alternatively, converter switches 136 are any other suitable transistor or any other suitable switching device, including, without limitation, gate turn-off thyristors (GTOs). Moreover, each pair of converter switches 136 for each phase is coupled in parallel with each pair of converter switches 136 for each other phase. As such, for a three phase power converter 104, boost converter 128 includes a first converter switch 138 coupled in series with a second converter switch 140, a third converter switch 142 coupled in series with a fourth converter switch 144, and a fifth converter switch 146 coupled in series with a sixth converter switch 148. First and second converter switches 138 and 140 are coupled in parallel with third and fourth converter switches 142 and 144, and with fifth and sixth converter switches 146 and 148. Alternatively, boost converter 128 may include any suitable number of converter switches 136 arranged in any suitable configuration.

Inverter 130, in the exemplary embodiment, includes two inverter switches 150 coupled together in serial arrangement for each phase of electrical power that power converter 104 produces. In the exemplary embodiment, inverter switches 150 are semiconductor devices, e.g., IGBTs. Alternatively, inverter switches 150 are any other suitable transistor or any other suitable switching device, including, without limitation, GTOs. Moreover, each pair of inverter switches 150 for each phase is coupled in parallel with each pair of inverter switches 150 for each other phase. As such, for a three phase power converter 104, inverter 130 includes a first inverter switch 152 coupled in series with a second inverter switch 154, a third inverter switch 156 coupled in series with a fourth inverter switch 158, and a fifth inverter switch 160 coupled in series with a sixth inverter switch 162. First and second inverter switches 152 and 154 are coupled in parallel with third and fourth inverter switches 156 and 158, and with fifth and sixth inverter switches 160 and 162. Alternatively, inverter 130 may include any suitable number of inverter switches 150 arranged in any suitable configuration.

Power converter 104 includes a control system 164 that includes a converter controller 166 and an inverter controller 168. Converter controller 166 is coupled to, and controls an operation of, boost converter 128. More specifically, in the exemplary embodiment, converter controller 166 operates boost converter 128 to maximize the power received from solar array 102. Inverter controller 168 is coupled to, and controls the operation of, inverter 130. More specifically, in the exemplary embodiment, inverter controller 168 operates inverter 130 to regulate the voltage across DC bus 132 and/or to adjust the voltage, current, phase, frequency, and/or any other characteristic of the power output from inverter 130 to substantially match the characteristics of electrical distribution network 106.

In the exemplary embodiment control system 164, converter controller 166, and/or inverter controller 168 include and/or are implemented by at least one processor. As used herein, the processor includes any suitable programmable circuit such as, without limitation, one or more systems and microcontrollers, microprocessors, a general purpose central processing unit (CPU), reduced instruction set circuits (RISC), application specific integrated circuits (ASIC), programmable logic circuits (PLC), field programmable gate arrays (FPGA), and/or any other circuit capable of executing the functions described herein. The above examples are exemplary only, and thus are not intended to limit in any way the definition and/or meaning of the term "processor."

In addition, control system 164, converter controller 166, and/or inverter controller 168 include at least one memory device (not shown) coupled to the processor that stores computer-executable instructions and data, such as operating data, parameters, setpoints, threshold values, and/or any other data that enables control system 164 to function as described herein. The memory device may include one or more tangible, non-transitory, computer readable media, such as, without limitation, random access memory (RAM), dynamic random access memory (DRAM), static random access memory (SRAM), a solid state disk, a hard disk, read-only memory (ROM), erasable programmable ROM (EPROM), electrically erasable programmable ROM (EEPROM), and/or non-volatile RAM (NVRAM) memory.

The methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, such as a firmware, physical and virtual storage, CD-ROMs, DVDs and another digital source such as a network or the Internet, as well as yet to be developed digital means, with the sole exception being a transitory, propagating signal.

Converter controller 166, in the exemplary embodiment, receives current measurements from first input current sensor 122, second input current sensor 124, and/or third input current sensor 126. Moreover, converter controller 166 receives measurements of a voltage of first input conductor 114, second input conductor 116, and/or third input conductor 118 from a plurality of input voltage sensors (not shown). Inverter controller 168, in the exemplary embodiment, receives current measurements from a first output current sensor 170, a second output current sensor 172, and/or a third output current sensor 174. Moreover, inverter controller 168 receives measurements of a voltage output from inverter 130 from a plurality of output voltage sensors (not shown). In the exemplary embodiment, converter controller 166 and/or inverter controller 168 receive voltage measurements of the voltage of DC bus 132 from a DC bus voltage sensor (not shown).

In the exemplary embodiment, inverter 130 is coupled to electrical distribution network 106 by a first output conductor 176, a second output conductor 178, and a third output conductor 180. Moreover, in the exemplary embodiment, inverter 130 provides a first phase of AC power to electrical distribution network 106 through first output conductor 176, a second phase of AC power to electrical distribution network 106 through second output conductor 178, and a third phase of AC power to electrical distribution network 106 through third output conductor 180. First output current sensor 170 is coupled to first output conductor 176 for measuring the current flowing through first output conductor 176. Second output current sensor 172 is coupled to second output conductor 178 for measuring the current flowing through second output conductor 178, and third output current sensor 174 is coupled to third output conductor 180 for measuring the current flowing through third output conductor 180.

At least one inductor 182 is coupled to each of first output conductor 176, second output conductor 178, and/or third output conductor 180. Inductors 182 facilitate filtering the output voltage and/or current received from inverter 130. Moreover, in the exemplary embodiment, an AC filter 184 is coupled to first output conductor 176, second output conductor 178, and/or third output conductor 180 for use in filtering an output voltage and/or current received from conductors 176, 178, and 180.

In the exemplary embodiment, at least one contactor 186 and/or at least one disconnect switch 188 are coupled to first output conductor 176, second output conductor 178, and/or third output conductor 180. Contactors 186 and disconnect switches 188 electrically disconnect inverter 130 from electrical distribution network 106, for example, if an error or a fault occurs within power generation system 100. Moreover, in the exemplary embodiment, protection device 110, contactors 186 and disconnect switches 188 are controlled by control system 164. Alternatively, protection device 110, contactors 186 and/or disconnect switches 188 are controlled by any other system that enables power converter 104 to function as described herein.

Power converter 104 also includes a bus charger 190 that is coupled to first output conductor 176, second output conductor 178, third output conductor 180, and to DC bus 132. In the exemplary embodiment, at least one charger contactor 192 is coupled to bus charger 190 for use in electrically disconnecting bus charger 190 from first output conductor 176, second output conductor 178, and/or third output conductor 180. Moreover, in the exemplary embodiment, bus charger 190 and/or charger contactors 192 are controlled by control system 164 for use in charging DC bus 132 to a predetermined voltage.

During operation, in the exemplary embodiment, solar array 102 generates DC power and transmits the DC power to boost converter 128. Converter controller 166 controls a switching of converter switches 136 to adjust an output of boost converter 128. More specifically, in the exemplary embodiment, converter controller 166 controls the switching of converter switches 136 to adjust the voltage and/or current received from solar array 102 such that the power received from solar array 102 is increased and/or maximized.

Inverter controller 168, in the exemplary embodiment, controls a switching of inverter switches 150 to adjust an output of inverter 130. More specifically, in the exemplary embodiment, inverter controller 168 uses a suitable control algorithm, such as pulse width modulation (PWM) and/or any other control algorithm, to transform the DC power received from boost converter 128 into three phase AC power signals. Alternatively, inverter controller 168 causes inverter 130 to transform the DC power into a single phase AC power signal or any other signal that enables power converter 104 to function as described herein.

In the exemplary embodiment, each phase of the AC power is filtered by AC filter 184, and the filtered three phase AC power is transmitted to electrical distribution network 106. In the exemplary embodiment, three phase AC power is also transmitted from electrical distribution network 106 to DC bus 132 by bus charger 190. In one embodiment, bus charger 190 uses the AC power to charge DC bus 132 to a suitable voltage amplitude, for example, during a startup and/or a shutdown sequence of power converter 104.

Alternative embodiments of power generation system 100 include other power generation devices that generate AC power, e.g., wind turbines, in contrast to the DC power generated by solar array 102. Generally, a wind turbine includes a rotor that includes a rotatable hub assembly having multiple blades. The blades transform wind energy into a mechanical rotational torque that drives one or more generators via the rotor. Variable speed operation of the wind turbine facilitates enhanced capture of energy when compared to a constant speed operation of the wind turbine. However, variable speed operation of the wind turbine produces electric power having varying voltage and/or frequency. More specifically, the frequency of the electric power generated by the variable speed wind turbine is proportional to the speed of rotation of the rotor. Typically, full power conversion assemblies, i.e., alternative embodiments of power converter 104 that include an electrical rectification device, may be coupled between the wind turbine's electric generator and electrical distribution network 106. The full power conversion assembly receives the electric power from the wind turbine generator and transmits electricity having a fixed voltage and frequency for further transmission to electrical distribution network 106.

In these alternative embodiments, the full power conversion assemblies include rectifiers for converting the AC generated by the wind turbine generator to DC power. Also, such full power conversion assemblies include an inverter substantially similar to inverter 130 coupled to the rectifier by a DC bus network to convert the DC power to AC power. Further, the rectifiers and inverters in such full power conversion assemblies includes a plurality of semiconductor devices similar to converter switches 136 within boost converter 128 and inverter switches 150 within inverter 130. Moreover, such rectifiers, inverters 130, and booster converters 128 are fully scalable for electric power conversion applications of any size, any voltage, any number of phases, and any frequencies.

In some alternative embodiments of wind turbines, doubly-fed induction generators (DFIGs) are used. Such configurations include DFIG converters that include two three-phase AC-DC converters coupled by a DC link. One AC-DC converter is connected to the grid and stator of the generator, and the other AC-DC converter is connected to the rotor of the generator. If the generator rotor is being turned at a speed slower than the synchronous speed, the DFIG converter will excite the rotor with reactive power. The rotor will then appear to be turning at a synchronous speed with respect to the stator and the stator will make the desired (synchronous frequency) power. If the generator rotor is being turned at synchronous speed, the DFIG converter will excite the rotor with DC power and the stator will generate the desired (synchronous frequency) power. If the generator rotor is being turned at a speed faster than the synchronous speed, the DFIG converter will excite the rotor with reactive power while at the same time extracting real power from the rotor. The rotor will then appear to be turning at a synchronous speed with respect to the stator and the stator will generate the desired (synchronous frequency) power. The frequency of the power extracted from the rotor will be converted to the synchronous frequency and added to the power generated by the stator.

Figure 2:
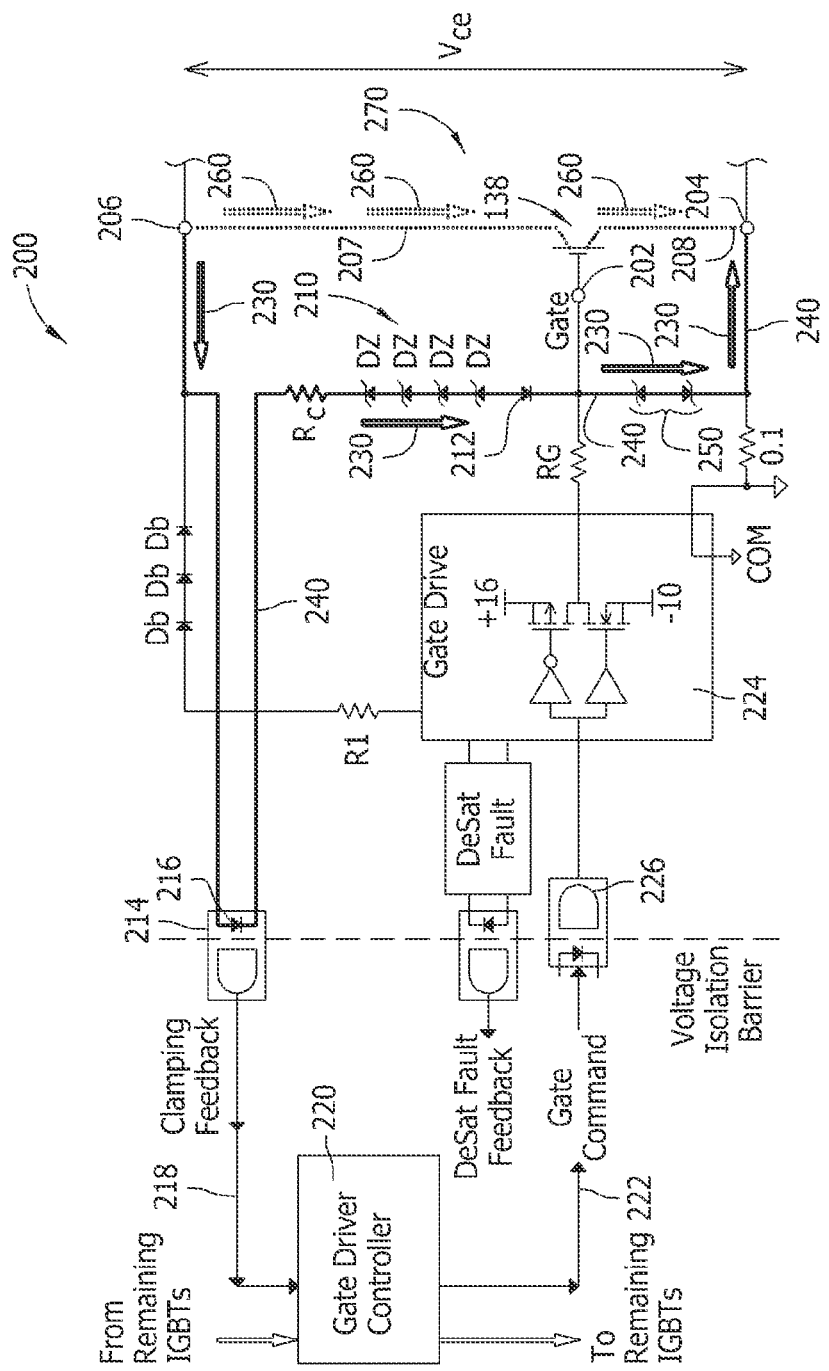
FIG. 2 is a schematic diagram of an exemplary insulated gate bipolar transistor (IGBT) regulating system that may be used with the power generation system shown in FIG. 1.

FIG. 2 is a schematic diagram of an exemplary insulated gate bipolar transistor (IGBT) regulating system 200 that may be used with power generation system 100 (shown in FIG. 1). In the exemplary embodiment, IGBT regulating system 200 is coupled to first converting switch 138 and each of converting switches 140 through 148 and 152 through 162 (all shown in FIG. 1). Alternatively, each converting switch 138 through 148 and 152 through 162 is coupled to an independent regulating system (not shown). Also, in the exemplary embodiment, first converting switch 138 is an IGBT and includes a gate terminal 202, an emitter terminal 204, and a collector terminal 206. A collector channel 207 couples first converter switch 138 with collector terminal 206 and an emitter channel 208 couples first converter switch 138 with emitter terminal 204. Collector channel 207 and emitter channel 208 are formed from current-conducting materials, e.g., without limitation, copper and aluminum, wherein such materials have a predetermined inductance. In the exemplary embodiment, channels 207 and 208 are configured to operate with voltages of approximately one kilovolt (kV) and greater. Alternatively, channels 207 and 208 are configured for any voltages that enable operation of power converter 104 as described herein. Voltages measured between collector terminal 206 and emitter terminal 204, i.e., are referred to herein as collector-to-emitter voltage $V_{CE}$.

Further, in the exemplary embodiment, IGBT regulating system 200 includes a clamping circuit 210 coupled to IGBT gate terminal 202. Clamping circuit 210 includes a plurality of Zener diodes DZ coupled in series with each other. Clamping circuit 210 also includes and a blocking diode 212 and a clamping resistor $R_C$. IGBT regulating system 200 also includes an opto-isolator, i.e., an optocoupler 214 that includes a blocking diode 216 coupled to clamping circuit 210, wherein optocoupler 210 is also coupled to IGBT collector terminal 206.

IGBT regulating system 200 further includes a clamping feedback channel 218 coupled to optocoupler 214. IGBT regulating system 200 also includes at least one gate driver controller 220 coupled to clamping feedback channel 218. IGBT regulating system 200 further includes a gate command channel 222 coupled to a gate driver circuit 224 through an optocoupler 226. In the exemplary embodiment, gate drive circuit 224 is a stand-alone device. Alternatively, gate driver circuit 224 is integrated into IGBT regulating system 200. Gate driver circuit 224 is coupled to IGBT gate terminal 202. In the exemplary embodiment, IGBT regulating system 200 and gate driver circuit 224 are configured to operate with voltages in a range of approximately zero to 24 volts (V). Alternatively, IGBT regulating system 200 and gate driver circuit 224 are configured for any voltages that enable operation of power converter 104 and IGBT regulating system 200 as described herein.

In the exemplary embodiment, optocoupler 214 is an electronic device that facilitates transmission of electrical signals by utilizing light waves to facilitate operative coupling and electrical isolation between the associated input and output. Optocoupler 214 connects the input side, i.e., clamping circuit 210, and output side, i.e., clamping feedback channel 218, with a beam of light modulated by the input current, i.e., current transmitted through clamping circuit 210. Optocoupler 214 transforms input signals representative of the current transmitted in clamping circuit 210. Optocoupler 214 transforms the current signals into light signals, transmits the light signals across a dielectric channel (not shown), captures the light signals on the output side, and transforms the light signals into electric signals representative of the current transmitted in clamping circuit 210. Optocoupler 214 is substantially unidirectional, does not transmit electric power, and transmits DC and/or slow-changing signals. Therefore, optocoupler 214 reduces a potential of high voltages or rapidly changing voltages on one side from distorting transmissions on the other side.

Also, in the exemplary embodiment, gate driver controller 220 is a stand-alone controller. Alternatively, gate drive controller 220 is implemented within one of, or partially in each of, converter controller 166 and inverter controller 168 (both shown in FIG. 1). Also alternatively, gate drive controller 220 is implemented elsewhere within control system 164 (shown in FIG. 1). Regardless of where implemented, gate drive controller 220 includes at least one memory device (not shown) coupled to a processor (not shown) that stores computer-executable instructions and data, such as operating data, parameters, setpoints, threshold values, and/or any other data that enables IGBT regulating system 200 to function as described herein. The methods as executed by IGBT regulating system 200, including gate drive controller 220, and as described herein, may be encoded as executable instructions embodied in a tangible, non-transitory, computer readable medium, including, without limitation, a storage device and/or a memory device. Such instructions, when executed by the processor, cause the processor to perform at least a portion of the methods described herein.

In operation, first converting switch 138 is in an IGBT-on condition and blocking diode 212 prevents current flow through clamping circuit 210 from gate terminal 202 to collector terminal 206. Zener diodes DZ prevent current flow in the opposite direction from collector terminal 206 to gate terminal 202. IGBT regulating system 200 is in a standby condition.

Also, in operation, converter controller 166 transmits an IGBT-off condition command. Stray inductances associated with collector channel 207 and emitter channel 208 and loads downstream (not shown) induce a voltage excursion at collector terminal 206 such that the Zener knee voltage of each of Zener diodes DZ is exceeded and a reverse current 230 is transmitted through a low-voltage, low-power path 240 that extends from collector terminal 206, through diode 216 of optocoupler 214, clamping circuit 210, and a pair of opposing Zener diodes 250 to emitter terminal 204. Clamping resistor $R_C$ facilitates inducing a significant portion of the voltage drop through path 240 and facilitates limiting the value of reverse current 230 to reduce a potential for excessive heating and inducement of thermal stresses in Zener diodes DZ. A voltage at gate terminal 202 is induced such that switch 138 is at least partially, and temporarily, maintained in an IGBT-on condition.

Further, in operation, optocoupler 214 transmits a feedback signal (not shown) to gate drive controller 220 through clamping feedback channel 218 that is representative of a conduction state of clamping circuit 210, i.e., a discrete determination of whether or not reverse current flow 230 is being transmitted through clamping circuit 210. Alternatively, a portion of the feedback signal may include information representative of a value of reverse current 230.

Moreover, in operation, the voltage excursion at collector terminal 206 induces a current 260 through a high-voltage, high-power path 270 that includes collector channel 207, switch 138, and emitter channel 208. Current 260 is also induced by stored energy that is proportional to the sum of the stray inductances associated with the load and channels 207 and 208. During such IGBT turn-off transients, an excursion of $V_{CE}$ is induced that is proportional to a rate of change of current 260 as a function of time, i.e., a di/dt, and the sum of the stray inductances. Controlling switch 138 by modulating the voltage at gate terminal 202 facilitates controlling flow of current 270 through switch 138, and therefore, path 270, thereby regulating the value of di/dt in path 270 and clamping the voltage at collector terminal 206.

In the exemplary embodiment, gate drive controller 220 is programmed with the necessary algorithms and instructions to execute a determination of how frequently clamping circuit 210 is transmitting reverse current 230 and for how long. Gate drive controller 220 generates event logging, including date and time stamping, of the incoming data. The presence of reverse current 230 is an indication that current 260 is present as well, and that clamping circuit 210 and path 270 are subject to thermal stresses. If current 230 detection frequencies and/or periods of transmission of current 230 exceeds a predetermined parameter, operational values such as, without limitation, an IGBT switching frequency and voltage amplitudes may need to be evaluated. Such data may also be helpful for analyzing the hardware design stress limits in the field and during lab testing and provide a traceable means for troubleshooting and analyzing any field failure issues.

Once reverse current 230 is sensed within clamping circuit 210, IGBT regulating system 200, including gate drive controller 220, is shifted from a standby condition to an active condition.

Also, in the exemplary embodiment, if the frequencies of the presence and/or time periods of reverse current 230 approach, or exceed, predetermined parameters, gate drive controller 220 is further programmed with the necessary algorithms and instructions to initiate at least one of a warning and an alarm at associated predetermined frequency and/or temporal warning/alarm setpoints. Such warnings and alarms alert operators to conditions that may be indicative of thermal stress ratings of switch 138 being approached, attained, or exceeded. Gate drive controller 220 is programmed with the necessary algorithms and instructions to remove power converter 104 from service, i.e., to trip power converter 104, in the event predetermined frequency and/or temporal tripping setpoints are attained or exceeded.

In some embodiments, gate drive controller 220 is further programmed with the necessary algorithms and instructions to regulate voltage at gate terminal 202 transmitting appropriate control signals (not shown) to gate driver device 224 through gate command channel 222 and optocoupler 226. Regulating voltage at gate terminal 202 through gate drive controller 220 in conjunction with the voltage control provided by clamping circuit 210, as described above, further facilitates controlling switch 138. Specifically, current 270 through switch 138 and path 270 is further regulated, thereby further regulating the value of di/dt in path 270 and further clamping the voltage at collector terminal 206. Such overall control of voltage at gate terminal 202 therefore reduces the potential of approaching and/or exceeding the thermal stress ratings of switch 138 and associated components. Once current 260 decreases to predetermined values as it is dissipated as heat within path 270, including switch 138, and the associated thermal stresses also decrease to predetermined values, IGBT regulating system 200 transmits an "IGBT-off command" and current flow through first converting switch 138 is substantially stopped. Therefore, IGBT regulating system 200 controls the rate of decrease of electric power transmission from collector terminal 206 to emitter terminal 204 to slow-down the rate of IGBT turn-off.

In some embodiments, in addition to the above, if the frequencies of the presence and/or time periods of reverse current 230 approach, or exceed, predetermined parameters, gate drive controller 220 is programmed with the necessary algorithms and instructions to regulate at least one other operational parameter of power converter 104 (shown in FIG. 1) rather than tripping. These operational parameters include, without limitation, decreasing the electric power transmitted from the power generation device, i.e., solar array 102 (shown in FIG. 1) to power converter 104, decreasing the electric power transmitted from power converter 104 to grid 106 (shown in FIG. 1), and reducing voltage on DC bus 132 (shown in FIG. 1).

Also, in some embodiments, gate drive controller 220 is programmed with the necessary algorithms and instructions to execute a determination of thermal stress values of at least one of clamping circuit 210 and switch 138. Such determination includes one or more of tabular comparisons and numerical conversions of values of reverse current 230 and values of current 260, respectively, to known thermal stress values. The relationship between values of reverse current 230 through clamping circuit 210 and related thermal stress values is established as a function of materials, sizes, and configuration of the associated current-carrying devices, e.g., Zener diodes DZ. Similarly, the relationship between values of current 260 through path 270 and related thermal stress values of associated current-carrying devices, e.g., first converting switch 138 and channels 207 and 208.

Further, in some embodiments, in addition to the above, gate drive controller 220 is programmed with the necessary algorithms and instructions to determine proximity of the measured values of reverse current 230 and current 260 and their associated thermal stress measurements to predetermined parameters. If the current and/or thermal stress measurements approach, or exceed, predetermined parameters, gate drive controller 220 is further programmed with the necessary algorithms and instructions to regulate voltage at gate terminal 202 as a function of at least one of reverse current 230, current 260, and the associated thermal stress determinations.

Regulating voltage at gate terminal 202 through gate drive controller 220 using currents and thermal stress determinations as primary and/or secondary variables, in conjunction with the voltage control provided by clamping circuit 210, as described above, further facilitates controlling switch 138. Under such integrated regulation, control of voltage at gate terminal 202 reduces the potential of approaching and/or exceeding the current and/or thermal stress ratings of switch 138 and associated components. Once current 260 decreases to predetermined values as it is dissipated as heat within path 270, including switch 138, and the associated thermal stresses also decrease to predetermined values, IGBT regulating system 200 transmits an "IGBT-off command" and current flow through first converting switch 138 is substantially stopped. Therefore, IGBT regulating system 200 controls the rate of decrease of electric power transmission from collector terminal 206 to emitter terminal 204 to slow-down the rate of IGBT turn-off.

Moreover, in some embodiments, in addition to the above, if the thermal stress measurements approach, or exceed, the predetermined parameters, gate drive controller 220 is further programmed with the necessary algorithms and instructions to initiate at least one of a warning and an alarm at associated predetermined current and/or thermal stress measurement setpoints. Gate drive controller 220 is further programmed with the necessary algorithms and instructions to regulate at least one operational parameter of power converter 104. These operational parameters include, without limitation, decreasing the electric power transmitted from the power generation device, i.e., solar array 102 to power converter 104, decreasing the electric power transmitted from power converter 104 to grid 106, reducing voltage on DC bus 132, and removing power converter 104 from service, i.e., tripping power converter 104.

Figure 3:
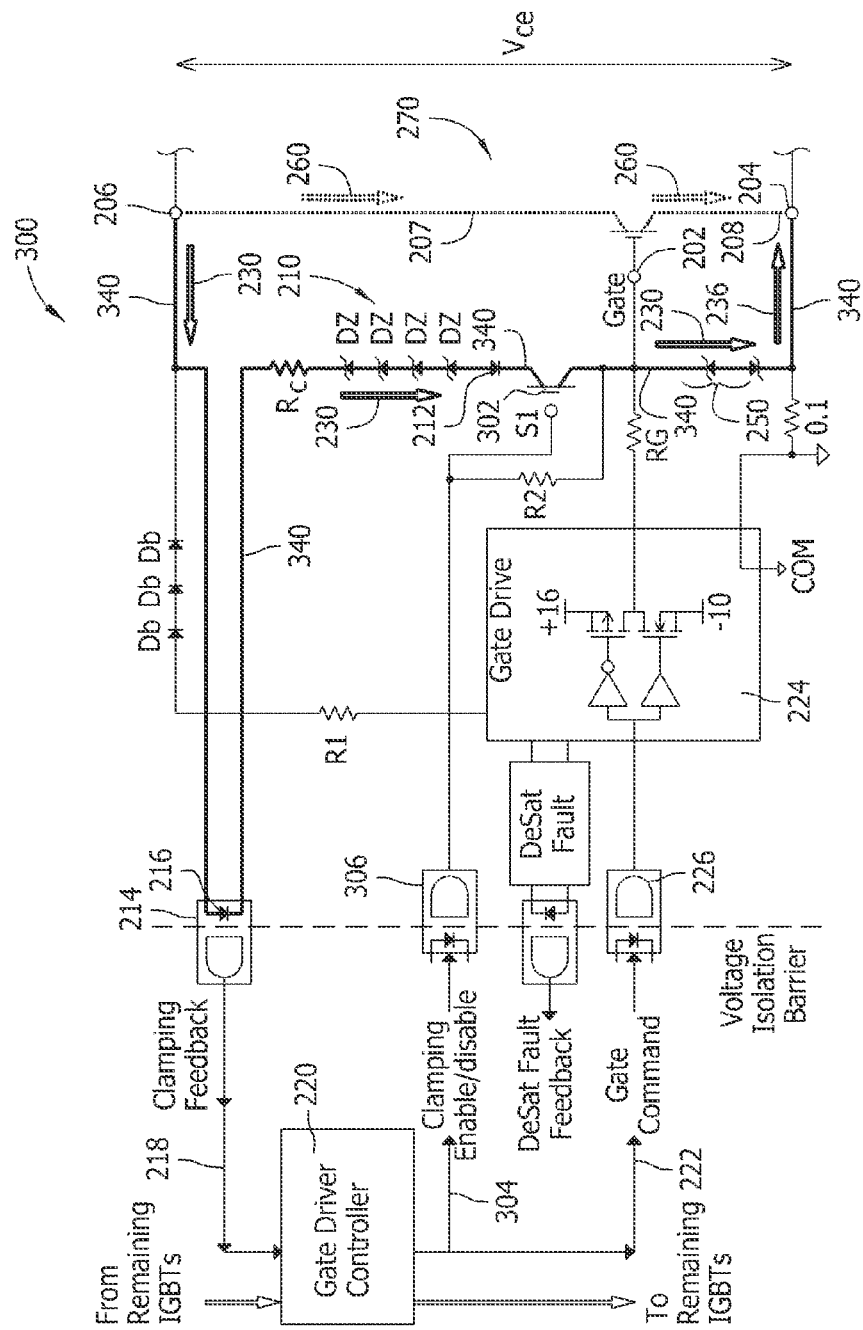
FIG. 3 is a schematic diagram of an alternative exemplary IGBT regulating system that may be used with the power generation system shown in FIG. 1.

FIG. 3 is a schematic diagram of an alternative exemplary IGBT regulating system 300 that may be used with power generation system 100 (shown in FIG. 1). System 300 is similar to system 200 (shown in FIG. 2) with the exception that system 300 includes an isolation switch device 302 coupled to IGBT gate terminal 202 and blocking diode 212 of clamping circuit 210. Isolation switch device 302 is also coupled to gate driver controller 220 through a clamping enabled/disabled channel 304 and an optocoupler 306. Operation of system 300 is similar to operation of system 200 with the exception of gate driver controller 220 programmed with the necessary algorithms and instructions to command switch 302 to "turn-off" and disable clamping circuit 210 in the event that reverse current 210 and/or the associated thermal stresses approach or exceed a predetermined parameter. Gate driver controller 220 may also command switch 302 to reclose, thereby enabling clamping circuit 210, therefore facilitating a "course" control of the thermal stresses until the values of reverse current 210 are reduced to a range such that the "fine" control described above is more effective. Moreover, when power converter 104 (shown in FIG. 1) is removed from service, switch 302 may be opened to reduce a potential for "false clamping" in the presence of externally-induced voltages.

The above-described embodiments facilitate increasing a power conversion rate and reliability of electric power converters. Specifically, the electric power converters described herein use an IGBT regulating system to facilitate controlling a rate of heat generation by IGBTs and Zener diodes within the electric power converters and thereby regulating dissipation of induced currents and heat generated therefrom. Also, specifically, such regulation facilitates improved heat generation within and heat removal from the IGBTs and Zener diodes that facilitates decreasing nominal operating temperatures and rate of temperature changes thereof, thereby decreasing a magnitude of thermal stresses induced in the IGBTs and Zener diodes. Furthermore, the above-described embodiments use clamping frequency and duration feedback from the clamping circuit as the primary variables for regulating the current transmitted therein. Moreover, the above-described embodiments use a combination of warnings, alarms, and protective actions to protect the IGBTs and Zener diodes. Also, the above-described embodiments use mechanisms that remove the Zener diodes, the IGBTs, and the electric power converter from service. Therefore, regulating the current transmitted through the IGBTs and Zener diodes and the temperature rise thereof facilitates increasing the ratings of the of the electric power conversion circuits (i.e., bridges), faster switching of the IGBTs, and improved power quality.

Exemplary embodiments of an electric power generation facility, electric power conversion apparatus, and IGBT regulating systems, and methods for operating the same are described above in detail. The methods, facilities, systems, and apparatus are not limited to the specific embodiments described herein, but rather, components of the facilities, systems, and apparatus, and/or steps of the methods may be utilized independently and separately from other components and/or steps described herein. For example, the power converters, IGBT regulating systems, and methods may also be used in combination with other power conversion apparatus and methods, and are not limited to practice with only the power systems as described herein. Rather, the exemplary embodiment can be implemented and utilized in connection with many other electric power conversion applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A regulating system for an insulated gate bipolar transistor (IGBT) that is coupled to a gate driver circuit, said regulating system comprising:
   a clamping circuit coupled to the IGBT;
   a feedback channel coupled to said clamping circuit, said feedback channel configured to transmit signals representative of a conduction state of said clamping circuit; and,
   at least one gate driver controller coupled to said feedback channel, said feedback channel configured to transmit the signals representative of the conduction state of said clamping circuit to said gate driver controller, said at least one gate driver controller further coupled to the gate driver circuit at a gate driver circuit input, said gate driver controller configured to regulate temporal periodicities of the IGBT in an on-condition and an off-condition, wherein said gate driver controller is configured to extract from the signals representative of the conduction state of said clamping circuit information representative of frequencies of reverse current transmission through said clamping circuit and control operation of said regulating system based on the information.

2. The regulating system in accordance with claim 1, further comprising at least one optocoupler coupled to said gate driver controller.

3. The regulating system in accordance with claim 1, wherein said clamping circuit comprises a plurality of Zener diodes coupled in series.

4. The regulating system in accordance with claim 1, wherein said clamping circuit comprises a plurality of Zener diodes coupled in series and at least one isolation switch device coupled in series with said Zener diodes.

5. The regulating system in accordance with claim 4, wherein said gate driver controller comprises one or more non-transitory computer-readable storage media having computer-executable instructions embodied thereon, wherein when executed by at least one processor, the computer-executable instructions cause the processor to operate said isolation switch device, thereby removing said clamping circuit from service.

6. The regulating system in accordance with claim 1, wherein said gate driver controller comprises one or more non-transitory computer-readable storage media having computer-executable instructions embodied thereon, wherein when executed by at least one processor, the computer-executable instructions cause the processor to determine thermal stress values of said clamping circuit based on electric currents measured in said clamping circuit.

7. The regulating system in accordance with claim 6, wherein said gate driver controller comprises one or more non-transitory computer-readable storage media having computer-executable instructions embodied thereon, wherein when executed by at least one processor, the computer-executable instructions cause the processor to at least one of:
    determine a value of reverse current transmitted through said clamping circuit;
    determine a value of temporal periods of detection of transmission of reverse current through said clamping circuit;
    determine a proximity of the thermal stress determinations of said clamping circuit to predetermined parameters;
    regulate electric current transmitted through said clamping circuit; and,
    initiate at least one of a warning and an alarm at a predetermined value of the thermal stress determinations.

8. An electric power converter comprising:
    a plurality of insulated gate bipolar transistors (IGBTs);
    a gate driver circuit coupled to each of said IGBTs; and,
    an IGBT regulating system comprising:
        a clamping circuit coupled to said IGBT;
        a feedback channel coupled to said clamping circuit and said gate driver circuit, said feedback channel configured to transmit signals representative of a conduction state of said clamping circuit; and,
        at least one gate driver controller coupled to said feedback channel, said feedback channel configured to transmit the signals representative of the conduction state of said clamping circuit to said gate driver controller, said at least one gate driver controller further coupled to said gate driver circuit at a gate driver circuit input, said gate driver controller configured to regulate temporal periodicities of said IGBT in an on-condition and an off-condition, wherein said gate driver controller is configured to extract from the signals representative of the conduction state of said clamping circuit information representative of frequencies of reverse current transmission through said clamping circuit and control operation of said IGBT regulating system based on the information.

9. The electric power converter in accordance with claim 8, further comprising at least one optocoupler coupled to said gate driver controller.

10. The electric power converter in accordance with claim 8, wherein said clamping circuit comprises a plurality of Zener diodes coupled in series.

11. The electric power converter in accordance with claim 8, wherein said clamping circuit comprises a plurality of Zener diodes coupled in series and at least one isolation switch device coupled in series with said Zener diodes.

12. The electric power converter in accordance with claim 11, wherein said gate driver controller comprises one or more non-transitory computer-readable storage media having computer-executable instructions embodied thereon, wherein when executed by at least one processor, the computer-executable instructions cause the processor to operate said isolation switch device, thereby removing said clamping circuit from service.

13. The electric power converter in accordance with claim 8, wherein said gate driver controller comprises one or more non-transitory computer-readable storage media having computer-executable instructions embodied thereon, wherein when executed by at least one processor, the computer-executable instructions cause the processor to determine thermal stress values of said clamping circuit based on the electric currents measured in said clamping circuit.

14. The electric power converter in accordance with claim 13, wherein said gate driver controller comprises one or more non-transitory computer-readable storage media having computer-executable instructions embodied thereon, wherein when executed by at least one processor, the computer-executable instructions cause the processor to at least one of:
    determine a value of reverse current transmitted through said clamping circuit;
    determine a value of temporal periods of detection of transmission of reverse current through said clamping circuit;
    determine a proximity of the thermal stress determinations of said clamping circuit to predetermined parameters;
    regulate electric current transmitted through said clamping circuit; and,
    initiate at least one of a warning and an alarm at a predetermined value of the thermal stress determinations.

15. A method of operating an electric power converter including a plurality of insulated gate bipolar transistors (IGBTs), a clamping circuit coupled to each of the IGBTs, and a gate driver controller coupled to the clamping circuit through a feedback channel, the feedback channel configured to transmit a feedback signal representative of a conduction state of the clamping circuit to the gate driver controller, the gate driver controller further coupled to a gate driver circuit at a gate driver circuit input, said method comprising:
    transmitting a reverse current through the clamping circuit;
    transmitting the feedback signal to the gate driver controller through the feedback channel, the feedback signal representative of the presence of reverse current;
    determining frequencies of reverse current transmission through the clamping circuit and,
    regulating at least one operational parameter of the electric power converter using the gate driver controller and the gate driver circuit through the gate driver circuit input at least partially based on the value of the frequencies of reverse current transmission.

16. The method in accordance with claim 15, wherein regulating at least one operational parameter of the electric power converter comprises at least one of:
- decreasing the electric power transmitted from a power generation device to the electric power converter; and,
- decreasing the electric power transmitted from the electric power converter.

17. The method in accordance with claim 15, further comprising at least one of:
- determining a value of reverse current transmitted through the clamping circuit;
- determining a value of temporal periods of detection of transmission of reverse current through the clamping circuit;
- determining thermal stress values of the clamping circuit based on the electric currents measured in the clamping circuit;
- determining a proximity of thermal stress measurements transmitted from the clamping circuit to predetermined parameters; and,
- initiating at least one of a warning and an alarm at a predetermined setpoint.

18. The method in accordance with claim 15, further comprising operating a switch device, thereby removing the clamping circuit from service.

19. The method in accordance with claim 15, wherein regulating at least one operational parameter of the electric power converter comprises removing the electric power converter from service.

20. The method in accordance with claim 15, wherein regulating at least one operational parameter of the electric power converter comprises reducing a voltage on a direct current (DC) bus coupled to the electric power converter.

* * * * *